(12) United States Patent
Takimoto et al.

(10) Patent No.: US 7,245,243 B2
(45) Date of Patent: Jul. 17, 2007

(54) LATERAL DOUBLE-DIFFUSED MOS TRANSISTOR AND MANUFACTURING METHOD THEREFOR

(75) Inventors: Takahiro Takimoto, Tenri (JP); Toshihiko Fukushima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/332,164

(22) Filed: Jan. 17, 2006

(65) Prior Publication Data

US 2006/0157781 A1 Jul. 20, 2006

(30) Foreign Application Priority Data

Jan. 18, 2005 (JP) ............................ P2005-009993

(51) Int. Cl.
*H03M 1/48* (2006.01)
(52) U.S. Cl. .................... 341/112; 257/315; 365/185.24
(58) Field of Classification Search ................ 341/112; 257/342, 330, 335, 344, 346
See application file for complete search history.

(56) References Cited

U.S. PATENT DOCUMENTS

| | | | | |
|---|---|---|---|---|
| 4,294,002 A | * | 10/1981 | Jambotkar et al. | 438/275 |
| 5,828,101 A | * | 10/1998 | Endo | 257/330 |
| 5,844,842 A | * | 12/1998 | Seki et al. | 365/185.24 |
| 6,570,213 B1 | * | 5/2003 | Wu | 257/315 |
| 6,683,349 B1 | * | 1/2004 | Taniguchi et al. | 257/342 |
| 2002/0109184 A1 | * | 8/2002 | Hower et al. | 257/335 |

FOREIGN PATENT DOCUMENTS

| | | |
|---|---|---|
| JP | 8167720 | 6/1996 |
| JP | 10506503 T | 6/1998 |
| JP | 11186550 | 7/1999 |
| JP | 11251597 | 9/1999 |
| JP | 11-340454 A | 12/1999 |
| JP | 2000-332247 A | 11/2000 |
| JP | 2003309257 | 10/2003 |
| JP | 2005093696 | 4/2005 |

* cited by examiner

*Primary Examiner*—Jean Bruner Jeanglaude
(74) *Attorney, Agent, or Firm*—Birch, Stewart, Kolasch & Birch, LLP

(57) ABSTRACT

The lateral double-diffused MOS transistor includes a drift region of a first conductive type provided on a semiconductor substrate of a second conductive type, and a body diffusion region of the second conductive type formed on the surface within the drift region. The MOS transistor includes a gate electrode formed in such a position as it covers from part of the body diffusion region to part of the drift region located outside the diffusion region via an insulating film. The MOS transistor further includes a source diffusion region of the first conductive type and a drain diffusion region of the first conductive type formed on top of the body diffusion region and top of the drift region, respectively, both of which correspond to both sides of the gate electrode. The drain diffusion region includes a deep diffusion portion which has a $\frac{1}{1000}$ or more concentration of a peak concentration of the source diffusion region and which is positioned deeper than the source diffusion region.

11 Claims, 3 Drawing Sheets

LATERAL DOUBLE-DIFFUSED MOS TRANSISTOR AND MANUFACTURING METHOD THEREFOR

CROSS-REFERENCE TO RELATED APPLICATION

This Nonprovisional application claims priority under 35 U.S.C. §119(a) on Patent Application No(s). 2005-009993 filed in Japan on Jan. 18, 2005, the entire contents of which are hereby incorporated by reference.

BACKGROUND OF THE INVENTION

The present invention relates to a lateral double-diffused MOS transistor and a manufacturing method therefor. More particularly, the invention relates to a lateral double-diffused MOS transistor having high breakdown voltage and low on-state resistance characteristics as well as a manufacturing method therefor.

In recent years, with the trend toward more multifunctional electronic equipment, semiconductor devices to be used therein have been diversified, confronting demands for higher breakdown-voltage, higher power, smaller size and lower power consumption. Achieving lower power consumption needs transistors of lower on-state resistance.

FIG. 6 shows the structure of a common lateral double-diffused MOS transistor. This lateral double-diffused MOS transistor is an N-channel type MOS transistor in this example and includes a lightly doped N-well diffusion region 102 serving as a drift region formed on a P-type silicon substrate 101. A P-body diffusion region 103 for forming a channel is formed on a surface within the lightly doped N-well diffusion region 102. A gate electrode 105 is provided in such a position as it covers from part of the P-body diffusion region 103 to part of the N-well diffusion region 102 located outside the diffusion region via gate oxide 104. An $N^+$ source diffusion region 106 and an $N^+$ drain diffusion region 107 are formed on top of the P-body diffusion region 103 and top of the N-well diffusion region 102, respectively, both of which correspond to both sides of the gate electrode 105. A region of the P-body diffusion region 103 which is located just under the gate electrode 105 and which is sandwiched by the $N^+$ source diffusion region 106 and the N-well diffusion region 102 forms the channel. Also, the P-body diffusion region 103 is short-circuited to the $N^+$ source diffusion region 106 via a $P^+$ backgating diffusion region 108 and unshown interconnections, thereby preventing operation of parasitic NPN.

The lateral double-diffused MOS transistor is required to have high breakdown voltage and low on-state resistance. The breakdown voltage depends on the horizontal distance between the P-body diffusion region 103 and the $N^+$ drain diffusion region 107 (length of drift region), and on the concentration of the N-well diffusion region 102. That is, the breakdown voltage becomes higher with increasing length of the drift region and decreasing concentration of the N-well diffusion region 102. However, lower on-state resistance, which is another necessary performance, necessitates shorter drift region and higher concentration of the N-well diffusion region 102. As a result of this, the relationship between breakdown voltage and on-state resistance is a trade-off. Moreover, the demand for smaller size makes it unacceptable to make a choice of elongating the drift region to increase the breakdown voltage.

In contrast to this, a DDD (Double Diffused Drain) structure as shown in FIG. 7, which is rather commonly used, and a structure as shown in FIG. 8 are proposed in JP H11-340454 A. It is noted that component elements in FIGS. 7 and 8 corresponding to those of FIG. 6 are designated by reference numerals obtained by addition of 100 and 200 for FIGS. 7 and 8, respectively, to those of FIG. 6. The structures shown in FIGS. 7 and 8 each have an N diffusion region (higher in concentration than N well diffusion region 202, 302 and lower in concentration than $N^+$ drain diffusion region 207, 307) 209, 309 which is provided so as to surround the $N^+$ drain diffusion region 207, 307, respectively. In these structures, since concentrations in vicinities of the $N^+$ drain diffusion region 207, 307 with respect to the horizontal direction out of the drift region is set higher, indeed the on-state resistance becomes somewhat lower than in the structure of FIG. 6, but the breakdown voltage still becomes lower.

SUMMARY OF THE INVENTION

Accordingly, an object of the present invention is to provide a lateral double-diffused MOS transistor which has high breakdown voltage and low on-state resistance characteristics.

In order to achieve the above object, there is provided a lateral double-diffused MOS transistor comprising:

a drift region of a first conductive type provided on a semiconductor substrate of a second conductive type;

a body diffusion region of the second conductive type formed on a surface within the drift region;

a gate electrode formed in such a position as it covers from part of the body diffusion region to part of the drift region located outside the diffusion region via an insulating film; and a source diffusion region of the first conductive type and a drain diffusion region of the first conductive type formed on top of the body diffusion region and top of the drift region, respectively, both of which correspond to both sides of the gate electrode, wherein the drain diffusion region includes a deep diffusion portion which has a $1/1000$ or more concentration of a peak concentration of the source diffusion region and which is positioned deeper than the source diffusion region.

Herein, the term "concentration" of a diffusion region refers to a concentration of a dopant which defines the conductive type (N type or P type) of the diffusion region.

The terms "peak concentration" of a diffusion region refer to a maximum value of concentration resulting when the concentration of the diffusion region have a spatial distribution.

In the lateral double-diffused MOS transistor according to the present invention, the drain diffusion region includes a deep diffusion portion which has a $1/1000$ or more concentration of a peak concentration of the source diffusion region and which is positioned deeper than the source diffusion region. As a result of this, the current path between the source diffusion region and the drain diffusion region is expanded depthwise on the drain diffusion region side in operation, as compared with the prior art example (FIG. 6), so that the on-state resistance is reduced. On the other hand, as to the drift region, setting its length and concentration substantially equal to those of the prior art example (FIG. 6) keeps the breakdown voltage from lowering. Thus, there can be realized a lateral double-diffused MOS transistor having high breakdown voltage and low on-state resistance characteristics.

Desirably, the drift region has a constant concentration over a region sandwiched by a concentration distribution of the body diffusion region and a concentration distribution (a concentration distribution of heavily doped diffusion) of the drain diffusion region with respect to the horizontal direction just under the gate electrode.

Also, the first-conductive-type drift region does not necessarily need to be formed directly on the second-conductive-type semiconductor substrate, and may be formed on a surface of a first-conductive-type semiconductor layer, e.g. epitaxial layer or the like, formed on the second-conductive-type semiconductor substrate.

Accordingly, in one embodiment, there is provided a lateral double-diffused MOS transistor, further comprising a semiconductor layer which is provided on the semiconductor substrate and which has a specified concentration of the first conductive type, wherein the drift region is formed of the semiconductor layer or a region which is formed on the semiconductor layer and which has a concentration different from the specified concentration.

In the lateral double-diffused MOS transistor of this one embodiment, the degree of freedom for device design is increased.

In one embodiment, there is provided a lateral double-diffused MOS transistor, wherein a surface concentration of the drain diffusion region is 10 times or more larger than a surface concentration of the first-conductive-type drift region.

In the lateral double-diffused MOS transistor of this one embodiment, since the surface concentration of the drain diffusion region is 10 times or more larger than the surface concentration of the first-conductive-type drift region, the dopant that defines the drain diffusion region can be diffused deep by rather less heat treatment. Thus, the deep diffusion portion of the drain diffusion region can be formed simply.

In one embodiment, there is provided a lateral double-diffused MOS transistor, wherein the drain diffusion region is composed of at least two different diffusion portions; and at least one of the diffusion portions forms the deep diffusion portion.

In the lateral double-diffused MOS transistor of this one embodiment, the drain diffusion region is composed of at least two different diffusion portions, the deep diffusion portion can be formed simply.

In one embodiment, there is provided a lateral double-diffused MOS transistor, wherein a dopant which defines one diffusion portion of the two diffusion portions is arsenic and another dopant which defines the other diffusion portion is phosphorus.

The lateral double-diffused MOS transistor of this one embodiment is manufactured simply. That is, normally, the source diffusion is formed from arsenic (As) and shallow in diffusion depth. Therefore, the one diffusion portion can be formed simultaneously with the source diffusion, so that the manufacturing cost does not increase. Also, the other diffusion portion, for which phosphorus (P) having a larger diffusion coefficient is used, can be diffused deep with less heat treatment. Accordingly, the deep diffusion portion can be made up simply by the other diffusion portion. As a result of this, the lateral double-diffused MOS transistor of this one embodiment is manufactured simply.

In one embodiment, there is provided a lateral double-diffused MOS transistor, wherein a diffusion depth of the drain diffusion region is equivalent to a diffusion depth of the body diffusion region.

Herein, the terms "diffusion depth" of a diffusion region refer to a distance over which a conductive type of the diffusion region continues depthwise from the semiconductor layer surface.

In the lateral double-diffused MOS transistor of this one embodiment, since the diffusion depth of the drain diffusion region is equivalent to the diffusion depth of the body diffusion region, the current path between the source diffusion region and the drain diffusion region is expanded enough depthwise on the drain diffusion region side in operation, so that the on-state resistance is reduced. Also, since the diffusion depth of the drain diffusion region is not deeper than necessary, the heat treatment for dopant diffusion can be saved.

In one embodiment, there is provided a lateral double-diffused MOS transistor, wherein a diffusion depth of the drain diffusion region is within a range of 1 μm to 3 μm.

In the lateral double-diffused MOS transistor of this one embodiment, the diffusion depth of the drain diffusion region, if falling within a range of 1 μm to 3 μm, is equivalent to that of a common body diffusion region. Accordingly, the current path between the source diffusion region and the drain diffusion region is expanded enough depthwise on the drain diffusion region side, so that the on-state resistance is reduced. Also, since the diffusion depth of the drain diffusion region is not deeper than necessary, the heat treatment for dopant diffusion can be saved.

In one embodiment, there is provided a lateral double-diffused MOS transistor, wherein a peak concentration of the deep diffusion portion of the drain diffusion region is $1 \times 10^{19}$ $cm^{-3}$ or more.

In the lateral double-diffused MOS transistor of this one embodiment, since the peak concentration of the deep diffusion portion is $1 \times 10^{19}$ $cm^{-3}$ or more, the current path between the source diffusion region and the drain diffusion region is reliably expanded enough depthwise on the drain diffusion region side in operation, as compared with the prior art example (FIG. 6), so that the on-state resistance is reduced.

In the present invention, there is provided a lateral double-diffused MOS transistor manufacturing method for manufacturing the lateral double-diffused MOS transistor, wherein one of the two diffusion portions, which forms the drain diffusion region, is formed simultaneously with the source diffusion region.

In the lateral double-diffused MOS transistor manufacturing method of this invention, one of the two diffusion portions that defines the drain diffusion region is formed simultaneously with the source diffusion region. Accordingly, compared with cases where those are formed independently of each other, the manufacturing process is simplified. Also, when the other diffusion portion out of the two diffusion portions is formed so as to serve as the deep diffusion portion, limitations on the surface concentration are eliminated. Accordingly, concentration control for the deep diffusion portion becomes easier to do. As a result of these, the lateral double-diffused MOS transistor can be manufactured easily.

In another aspect of the present invention, there is provided a lateral double-diffused MOS transistor manufacturing method for manufacturing the lateral double-diffused MOS transistor, wherein the deep diffusion portion of the drain diffusion region is formed by using a high-energy ion implantation method.

Herein, the terms, high-energy ion implantation method, refer to ion implanting of a dopant at an acceleration energy of 500 keV or more.

In the lateral double-diffused MOS transistor manufacturing method of this invention, since the dopant is implanted deep by the high-energy ion implantation method, the heat treatment for dopant diffusion can be saved and the deep diffusion portion of the drain diffusion region can be formed simply. Thus, the throughput is improved and the productivity is enhanced. Further, the horizontal diffusion of the drain diffusion region is suppressed. Therefore, the lateral double-diffused MOS transistor is manufactured simply and obtained.

Further, desirably, the high energy is within a range from 500 keV to 1.5 MeV.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Hereinbelow, the present invention will be described in detail by way of embodiments thereof illustrated in the accompanying drawings.

In the following embodiments, it is assumed that the first conductive type is N type and the second conductive type is P type.

(First Embodiment)

Figure 1:
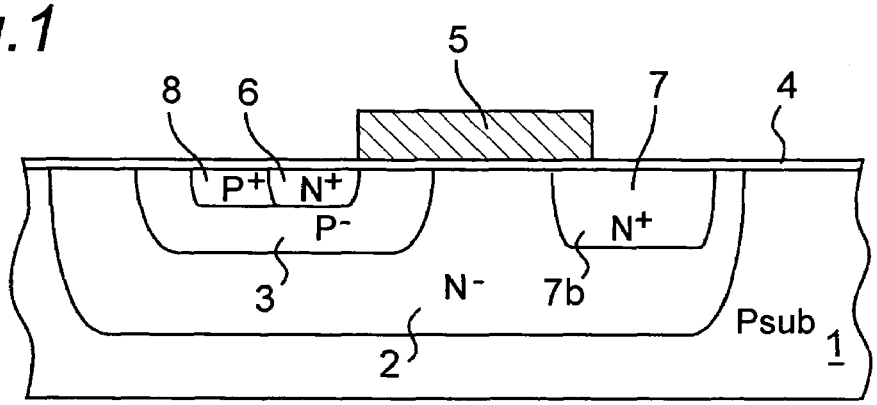
FIG. 1 is a sectional view showing a lateral double-diffused MOS transistor which is a first embodiment of the present invention.

FIG. 1 shows a cross-sectional structure of a lateral double-diffused MOS transistor which is a first embodiment of the present invention. This lateral double-diffused MOS transistor is an N-channel type MOS transistor in this example and includes a lightly doped N-well diffusion region 2 serving as a drift region formed on a P-type substrate 1. A P-type body diffusion region 3 for forming a channel is formed on a surface within the lightly doped N-well diffusion region 102. A gate electrode 5 is provided in such a position as it covers from part of the P-body diffusion region 3 to part of the N-well diffusion region 2 located outside the diffusion region via gate oxide 4 serving as an insulating film. An N$^+$ source diffusion region 6 and an N$^+$ drain diffusion region 7 are formed on top of the P-body diffusion region 3 and top of the N-well diffusion region 2, respectively, both of which correspond to both sides of the gate electrode 5. A region of the P-body diffusion region 3 which is located just under the gate electrode 5 and which is sandwiched by the N$^+$ source diffusion region 6 and the N-well diffusion region 2 forms the channel. Also, the P-body diffusion region 3 is short-circuited to the N$^+$ source diffusion region 6 via a P$^+$ backgating diffusion region 8 and unshown interconnections, thereby preventing operation of parasitic NPN. Other interconnections, field film and overcoat film are omitted in description for simplicity's sake.

As will be detailed later, this lateral double-diffused MOS transistor is characterized in that the drain diffusion region 7 includes a deep diffusion portion 7b which has a 1/1000 or more concentration of the peak concentration of the source diffusion region 6 and which is positioned deeper than the source diffusion region 6.

The lateral double-diffused MOS transistor is manufactured in the following steps.

First, phosphorus as an N-type dopant is ion implanted into a surface of the P-type <100> substrate 1 to a level of about $1\times10^{13}$ atoms/cm$^2$, and thereafter heat treatment (drive-in) at 1200° C. for 400 minutes is performed, by which an N-type drift region 2 is formed. Subsequently, boron as a P-type dopant is ion implanted into a surface of the N-type drift region 2 to a level of about $1\times10^{13}$ atoms/cm$^2$, by which a P-type body diffusion region 3 serving as a channel is formed.

Next, on the substrate surface, silicon oxide is formed to a thickness of about 30 nm as gate oxide 4. Subsequently, polysilicon is formed on the gate oxide 4, and the polysilicon is patterned to serve as a gate electrode 5. In this process, the gate electrode 5 is positioned so as to stretch over the P-type body diffusion region 3 to the N-well diffusion region 2. In operation, a portion of the P-type body diffusion region 3 with which the gate electrode 5 overlaps forms the channel.

Next, phosphorus as an N-type dopant is ion implanted in self alignment into a region on one side of the gate electrode 5 opposite to the P-type body diffusion region 3 to a level of about $6\times10^{15}$ atoms/cm$^2$, and thereafter annealing at 1000° C. for 60 minutes is performed, by which a drain diffusion region 7 is formed. In this process, the drain diffusion region 7 is set to a depth of about 1.5 μm to 2.0 μm, which is generally equal to that of the P-type body diffusion region 3, and set to a surface concentration of about $2\times10^{19}$ cm$^{-3}$.

Next, phosphorus as an N-type dopant is ion implanted in self alignment with the gate electrode into a surface of the P-type body diffusion region 3 to a level of about $4\times10^{15}$ atoms/cm$^2$, by which a source diffusion region 6 is formed. In this process, the source diffusion region 6 is set to a depth of about 0.2 μm and a surface concentration of about $1\times10^{20}$ cm$^{-3}$.

Finally, for backgating of the P-type body diffusion region 3, a P$^+$ backgating diffusion region 8 is formed along the source diffusion region 6, and the source diffusion region 6 and the P$^+$ backgating diffusion region 8 are short-circuited with each other by unshown interconnections.

Figure 6:
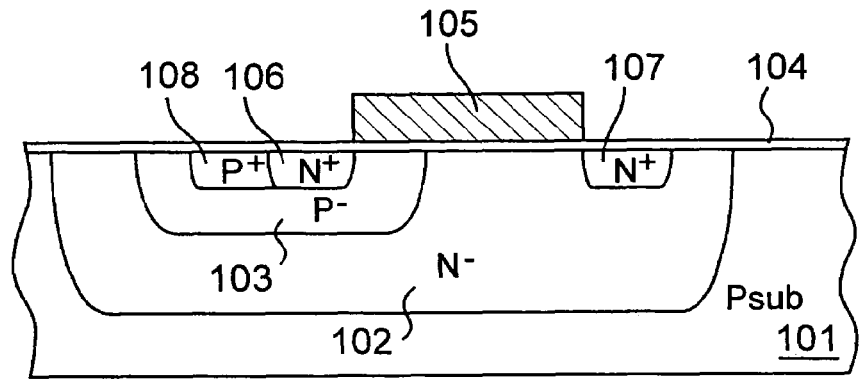
FIG. 6 is a sectional view showing a common lateral double-diffused MOS transistor according to the prior art.
Figure 7:
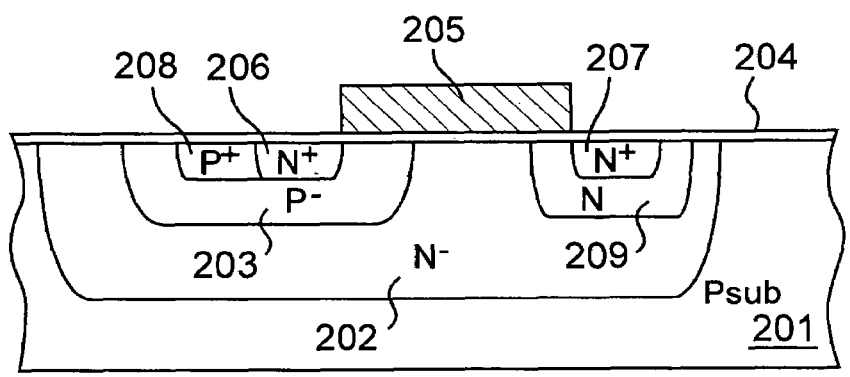
FIG. 7 is a sectional view showing a lateral double-diffused MOS transistor having a DDD structure according to the prior art.
Figure 8:
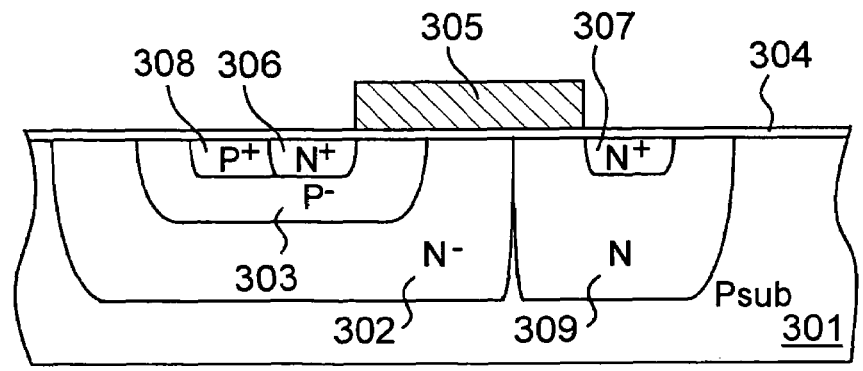
FIG. 8 is a sectional view showing a lateral double-diffused MOS transistor proposed in JP H11-340454 A.

As already described, this lateral double-diffused MOS transistor is characterized in that the drain diffusion region 7 includes a deep diffusion portion 7b which has a 1/1000 or more concentration of the peak concentration of the source diffusion region 6 and which is positioned deeper than the source diffusion region 6. On the other hand, the drift region is set to a length (a horizontal distance between the P-body diffusion region 3 and the N$^+$ drain diffusion region 7) and a concentration generally equal to those of the prior art example (the one of FIG. 6).

In manufacturing process for an ordinary lateral double-diffused MOS transistor, since the drain diffusion region and the source diffusion region are used also as the source/drain diffusion region of the MOS transistor in the logical part, arsenic as a dopant is often used for the formation by ion implantation simultaneously with those regions and for suppression of horizontal diffusion. Arsenic, which is lower in diffusion rate than phosphorus, has a diffusion depth as small as 0.2 μm. As a result of this, the drain current flows only through the very surface and the on-state resistance is high. However, in the lateral double-diffused MOS transistor of the present invention, since the drain diffusion region 7 is deep enough in diffusion depth, amounting to about 1.5 μm or more, the path through which the drain current flows in operation is expanded depthwise. Accordingly, even under conditions that length and concentration of the drift region are substantially identical to those of the prior art example (FIG. 6), a higher amount of drain current flows, so that the on-state resistance is reduced.

Also, in the lateral double-diffused MOS transistor of the present invention, not arsenic but phosphorus is used for the formation of the drain diffusion region 7. Since phosphorus is higher in diffusion rate than arsenic as described above, the depth of the drain diffusion region 7 can be set to a desired one by less heat treatment. Thus, the throughput is improved and the productivity is enhanced.

The diffusion depth of the drain diffusion region 7 is not desired to be as deep as possible, but desired to be set to a depth of about 1 to 3 μm, which is equivalent to the depth of the P-type body diffusion region 3. The reason of the setting to 1 μm or more is to reduce the on-state resistance as described above. Also, the reason of the setting to 3 μm or less is that even if the diffusion depth of the drain diffusion region 7 is set extremely deeper than the channel, carriers do not move once toward higher-resistance deeper portions so as to reach the heavily-doped drain diffusion region 7, thus not contributing to the reduction of the on-state resistance. Still, forming the drain diffusion region 7 too deep would cause the following two disadvantages. One disadvantage is that forming the diffusion region deep would necessitate longer heat treatment, taking time and labor for the formation of the drain diffusion region 7, so that the productivity would become poorer, resulting in poorer productivity. The other disadvantage is that the dopant would diffuse both depthwise and horizontally in the deep diffusion-region formation for the drain diffusion region 7. That is, heavily-doped diffusion would project into the drift region. The result is equivalent to a shortened drift region, which could make the breakdown voltage lower.

In addition, for reduction of the heat treatment, it is conceivable to enhance the implantation energy of the dopant (phosphorus in this example) for the formation of the drain diffusion region 7. However, on condition that the drain diffusion region 7 has a simple concentration distribution as in this embodiment, the surface concentration of the drain diffusion region 7 becomes lower so that the contact resistance may become higher. Thus, the implantation energy cannot be set so high.

Also, the surface concentration of the drain diffusion region 7 is so set as to become about $2\times10^{19}$ cm$^{-3}$. The reason of this is that too low concentrations would cause the contact resistance to become higher and also the drain resistance to become higher.

In addition, the conductive type of each region of the lateral double-diffused MOS transistor may be inverted altogether, in which case also a similar on-state resistance reduction effect by the deep formation of the drain diffusion region can be obtained.

(Second Embodiment)

Figure 2:
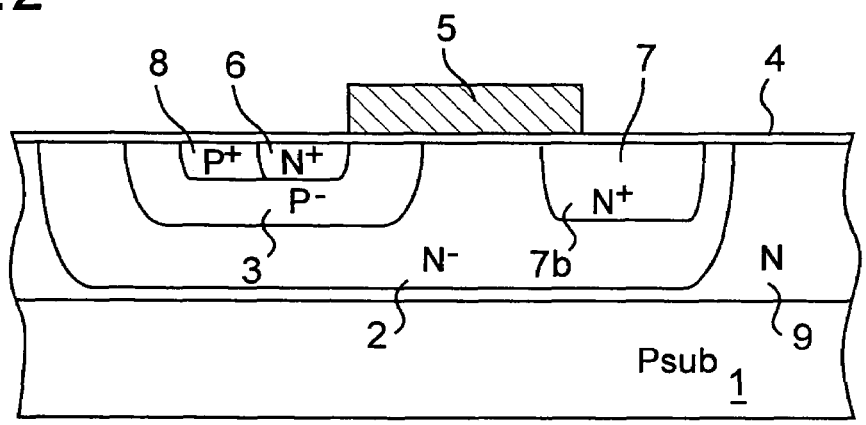
FIG. 2 is a sectional view showing a lateral double-diffused MOS transistor which is a second embodiment of the present invention.

FIG. 2 shows a cross-sectional structure of a lateral double-diffused MOS transistor which is a second embodiment of the present invention. It is noted that component elements similar to those of FIG. 1 are designated by the same reference numerals. As in FIG. 1, interconnections, field film and overcoat film are omitted in illustration.

This lateral double-diffused MOS transistor differs from that of the first embodiment in that the MOS transistor is formed not in the P-type silicon substrate 1 but in an N-type epitaxial layer 9 formed on the P-type silicon substrate 1.

In some cases, MOS transistors are used in combination with bipolar transistors for improvement of their analog characteristic. In such a case, an N-type epitaxial layer 9 having a specified concentration may be formed on the P-type silicon substrate 1. In the example of FIG. 2, on top of such an N-type epitaxial layer 9 is formed an N-type drift region 2 having a concentration different from that of the layer 9. Otherwise, the MOS transistor is fabricated by the absolutely same processes as in the first embodiment and absolutely identical in structure thereto. Accordingly, a similar on-state resistance reduction effect can be obtained, and the breakdown voltage does not lower as well. Still, the degree of freedom for device design is increased by the provision of the N-type epitaxial layer 9.

It is noted that if the concentration of the N-type epitaxial layer 9 is proper as a concentration of the drift region, then the N-type epitaxial layer 9 may be used as it is as the N-type drift region.

The conductive type of each region of the lateral double-diffused MOS transistor may be inverted altogether, in which case also a similar on-state resistance reduction effect by the deep formation of the drain diffusion region can be obtained.

(Third Embodiment)

Figure 3:
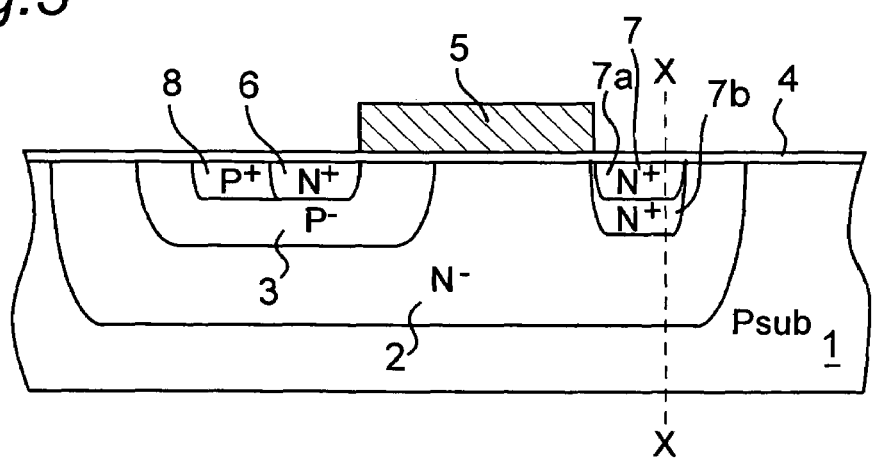
FIG. 3 is a sectional view showing a lateral double-diffused MOS transistor which is a third embodiment of the present invention.

FIG. 3 shows a cross-sectional structure of a lateral double-diffused MOS transistor which is a third embodiment of the present invention. It is noted that component elements similar to those of FIG. 1 are designated by the same reference numerals. As in FIG. 1, interconnections, field film and overcoat film are omitted in illustration.

This lateral double-diffused MOS transistor differs from the first and second embodiments in that the drain diffusion region 7 is composed of two portions, a shallow diffusion portion 7a and a deep diffusion portion 7b, having different concentration distributions. The shallow diffusion portion 7a, which is formed shallow by using arsenic, is formed simultaneously with the source diffusion region 6 and in self alignment with the gate electrode 5. The deep diffusion portion 7b, which is formed deep by using phosphorus, has a 1/1000 or more concentration of the peak concentration of the source diffusion region 6 and is positioned deeper than the source diffusion region 6.

Since the lateral double-diffused MOS transistor has the deep diffusion portion 7b that has a 1/1000 or more concentration of the peak concentration of the source diffusion region 6 and that is positioned deeper than the source diffusion region 6 as in the case of the first and second embodiments, the on-state resistance reduction effect can be obtained.

Still, this lateral double-diffused MOS transistor has the following advantages.

Figure 4:
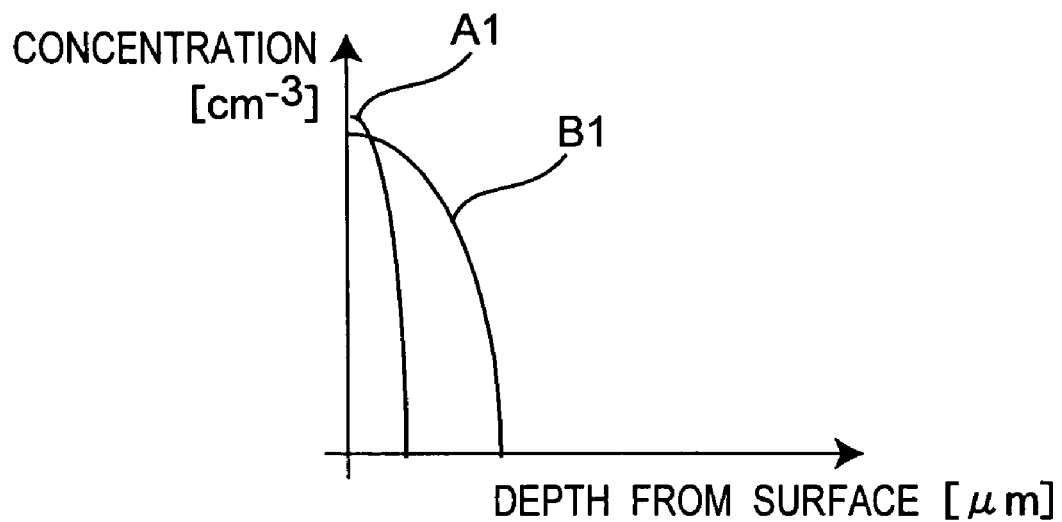
FIG. 4 is a view showing a concentration profile along the line X—X of the lateral double-diffused MOS transistor of FIG. 3 with normal implantation energy used.

FIG. 4 shows a concentration profile along the line X—X of FIG. 3 in the case where normal implantation energy (e.g., 150 keV) is used for both arsenic and phosphorus as N-type dopants for the formation of the drain diffusion region 7 (i.e., diffusion portions 7a, 7b) by ion implantation. In the figure, A1 indicates the concentration of arsenic and B1 indicates the concentration of phosphorus. Whereas high-temperature heat treatment needs to be elongated for the formation of the deep diffusion portion 7b, the heat treatment causes the diffusion to progress also horizontally, causing the breakdown voltage to lower, as described above. Therefore, too elongated heat treatment cannot be done, posing a limitation of the diffusion depth.

Figure 5:
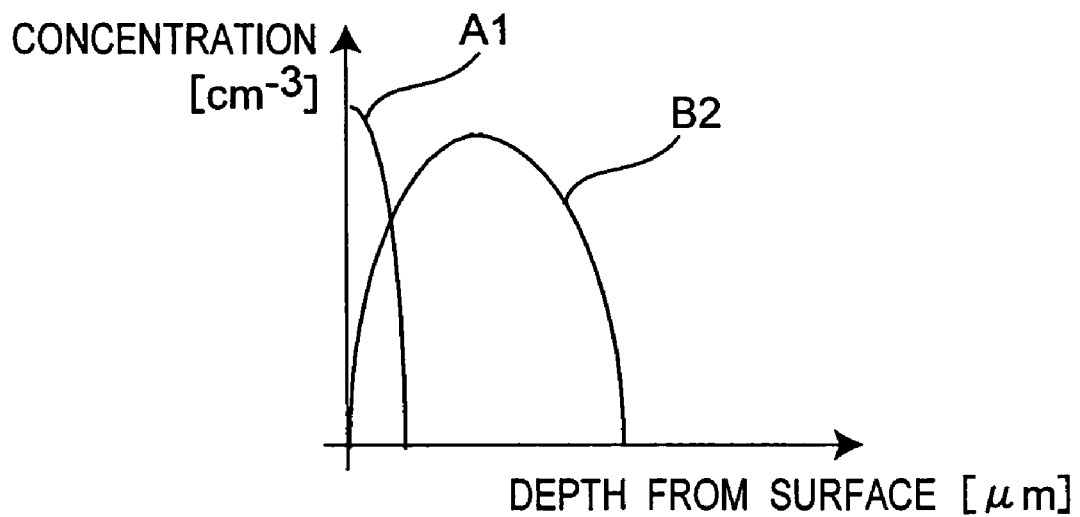
FIG. 5 is a view showing a concentration profile along the line X—X of the lateral double-diffused MOS transistor of FIG. 3 with high implantation energy used.

As a solution to this, as mentioned a little also in the first embodiment, it is conceivable that a dopant (phosphorus) for forming the deep diffusion portion 7b of the drain diffusion region 7 is implanted at high energy (with an acceleration energy of 500 keV or more). This high-energy implantation method, in which phosphorus is implanted deep with high energy, requires less heat treatment, with the result that the horizontal diffusion expansion of phosphorus can be suppressed. However, with the use of high energy implantation, the concentration profile of phosphorus results in one having a low concentration at the semiconductor layer surface as indicated by B2 in FIG. 5. This poses a fear of increase in contact resistance. That is, when the energy is excessively high conversely, this causes a problem of contact resistance. Therefore, the energy is desirably under about 1.5 Mev. Also, desirably, the drain diffusion region 7 is composed of two portions, the deep diffusion portion 7b of phosphorus and the shallow diffusion portion 7a of arsenic, as in this embodiment, so that decrease of the surface concentration of the drain diffusion region 7 is suppressed. As a result of this, there no longer occurs any increase in the contact resistance with interconnections due to a decrease in the surface concentration of the drain diffusion region 7. Further, the shallow diffusion portion 7a of arsenic can be formed simultaneously with the source diffusion region 6, and therefore formed without cost increases.

In addition, forming the shallow diffusion portion 7a as described above is effective for cases where the high energy implantation is impracticable in terms of equipment or cost and so the horizontal diffusion is suppressed by suppressing the concentration of the deep diffusion portion 7b.

Furthermore, the conductive type of each region of the lateral double-diffused MOS transistor may be inverted altogether, in which case also a similar on-state resistance reduction effect by the deep formation of the drain diffusion region can be obtained.

In the foregoing individual embodiments, a silicon substrate is used as the semiconductor substrate and arsenic and phosphorus are used as the dopants. However, without being limited to this, various materials for use in semiconductor manufacturing may be used. Also, the present invention is widely applicable for lateral double-diffused MOS transistors using compound semiconductors.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A lateral double-diffused MOS transistor comprising:
   a drift region of a first conductive type provided on a semiconductor substrate of a second conductive type;
   a body diffusion region of the second conductive type formed on a surface within the drift region;
   a gate electrode formed in such a position as it covers from part of the body diffusion region to part of the drift region located outside the diffusion region via an insulating film; and
   a source diffusion region of the first conductive type and a drain diffusion region of the first conductive type formed on top of the body diffusion region and top of the drift region, respectively, both of which correspond to both sides of the gate electrode, wherein
   the drain diffusion region includes a deep diffusion portion which has a 1/1000 or more concentration of a peak concentration of the source diffusion region and which is positioned deeper than the source diffusion region.

2. The lateral double-diffused MOS transistor as claimed in claim 1, further comprising:
   a semiconductor layer which is provided on the semiconductor substrate and which has a specified concentration of the first conductive type, wherein
   the drift region is formed of the semiconductor layer or a region which is formed on the semiconductor layer and which has concentration different from the specified concentration.

3. The lateral double-diffused MOS transistor as claimed in claim 1, wherein
   a surface concentration of the drain diffusion region is 10 times or more larger than a surface concentration of the first-conductive-type drift region.

4. The lateral double-diffused MOS transistor as claimed in claim 1, wherein
   the drain diffusion region is composed of at least two different diffused portions; and
   at least one of the diffusion portions forms the deep diffusion portion.

5. The lateral double-diffused MOS transistor as claimed in claim 4, wherein
   a dopant which defines one diffusion portion of the two diffusion portions is arsenic and another dopant which defines the other diffusion portion is phorsphorus.

6. The lateral double-diffused MOS transistor as claimed in claim 4, wherein
   a diffusion depth of the drain diffusion region is equivalent to a diffusion depth of the body diffusion region.

7. The lateral double-diffusion MOS transistor as claimed in claim 4, wherein
   a diffusion depth of the drain diffusion region is within a range of 1 μm to 3 μm.

8. The lateral double-diffused MOS transistor as claimed in claim 1, wherein
   a peak concentration of the deep diffusion portion of the drain diffusion region is $1 \times 10^{19}$ cm$^{-3}$ or more.

9. The lateral double-diffused MOS transistor claimed in claim 4, wherein one of the two diffusion portions, which forms the drain diffusion region, is formed simultaneously with the source diffusion region.

10. The lateral double-diffused MOS transistor claimed in claim 1, wherein the deep diffusion portion of the drain diffusion region is formed by using a high-energy ion implantation method.

11. The lateral double-diffused MOS transistor claimed in claim 10, wherein
    the high energy is within a range from 500 keV to 1.5 MeV.

* * * * *